United States Patent
Kim et al.

(10) Patent No.: US 7,067,413 B2
(45) Date of Patent: Jun. 27, 2006

(54) WIRE BONDING METHOD, SEMICONDUCTOR CHIP, AND SEMICONDUCTOR PACKAGE

(75) Inventors: Jin-Ho Kim, Suwon-si (KR); In-Ku Kang, Cheonan-si (KR); Sang-Yeop Lee, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 10/885,769

(22) Filed: Jul. 8, 2004

(65) Prior Publication Data

US 2005/0054186 A1 Mar. 10, 2005

(30) Foreign Application Priority Data

Sep. 4, 2003 (KR) .................. 10-2003-0061760

(51) Int. Cl.
*H01L 21/44* (2006.01)

(52) U.S. Cl. .................. 438/617; 257/784; 257/785

(58) Field of Classification Search ........ 438/612–617; 257/780, 782, 784, 785
See application file for complete search history.

(56) References Cited

U.S. PATENT DOCUMENTS

| | | | |
|---|---|---|---|
| 5,328,079 A | 7/1994 | Mathew et al. | |
| 5,516,029 A | 5/1996 | Grasso et al. | |
| 5,527,740 A | 6/1996 | Golwalkar et al. | |
| 6,329,278 B1 | 12/2001 | Low et al. | |
| 6,787,926 B1* | 9/2004 | Chen et al. | 257/784 |
| 2003/0042621 A1 | 3/2003 | Chen et al. | |
| 2003/0222338 A1* | 12/2003 | Wallace | 257/691 |
| 2004/0152292 A1* | 8/2004 | Babinetz et al. | 438/617 |

FOREIGN PATENT DOCUMENTS

| | | |
|---|---|---|
| JP | 55-118643 | 9/1980 |
| JP | 04-293244 | 10/1992 |
| JP | 04-294552 | 10/1992 |
| JP | 07-335682 | 12/1995 |
| KR | 0148883 | 6/1998 |
| KR | 10-0243555 | 11/1999 |
| KR | 10-0350084 | 8/2002 |

* cited by examiner

*Primary Examiner*—David Nelms
*Assistant Examiner*—Quoc Hoang
(74) *Attorney, Agent, or Firm*—Harness, Dickey & Pierce, P.L.C.

(57) ABSTRACT

A method of wire bonding, a semiconductor chip, and a semiconductor package provides stitch-stitch bonds of a wire on a bond pad of a chip as well as on a bond position of a substrate. A ball-stitch bump is formed on an end of the wire extending from a capillary or provided on the bond pad of the chip. A ball-stitch bump is formed on the bond pad of the chip by pressing down the ball of the wire on the bond pad. A ball-stitch stitch bond of the wire is formed on the ball-stitch bump by pressing down the wire on the ball-stitch bump. The capillary is moved from the bond pad to the bond position, while loosening the wire. A stitch bond of the wire is formed on the bond position by pressing down the wire on the bond position, and then separated from the wire within the capillary. The method of wire bonding, a semiconductor chip, and a semiconductor package can reduce or minimize a moving path of the capillary and provide more effective wire bonding.

14 Claims, 4 Drawing Sheets

WIRE BONDING METHOD, SEMICONDUCTOR CHIP, AND SEMICONDUCTOR PACKAGE

CROSS REFERENCE TO RELATED APPLICATIONS

This U.S. non-provisional application claims priority under 35 U.S.C. § 119 to Korean Patent Application No. 2003-61760 filed Sep. 4, 2003, the contents of which are incorporated by reference.

BACKGROUND OF THE INVENTION

1. Field of the Invention

The present invention relates generally to electronic packaging and, more particularly, to a method of wire bonding, a semiconductor chip, and a semiconductor package.

2. Description of the Related Art

In general, an electronic package is defined as the housing and interconnection of integrated circuits, also referred to as 'semiconductor device', 'chip' or 'die', to form an electronic system. The package should provide a structure to physically support the chip and to protect the chip from the environment, means for removing heat generated by the chips or system, and/or electrical connections to provide signal and power access to and from the chip.

Wire bonding technology is a conventional technique used to make electrical connections within the package. Wire bonding may employ gold, aluminum, or copper wires. A wire is bonded at one end to the chip and at the other end to a next-level substrate such as a lead frame, a printed circuit board, a ceramic substrate, or a flexible circuit board.

A conventional technique of wire bonding is to form a ball bond on the chip and a stitch bond on the substrate. More particularly, a ball is formed on a tail of the wire, which extends from the end of a capillary of a wire bonder, and is bonded to a bond pad of the chip under pressure by the capillary while heat and/or ultrasonic vibration are applied. After the ball bond is formed, a loop is formed in the wire by subsequent action of the capillary. The capillary deforms the wire against a bond position of the substrate, producing a wedge-shaped stitch bond. The cycle is then completed and the next ball bond can be formed.

This wire bonding technique requires sufficient height of the wire over the top of the chip so as to produce and maintain a stable loop in the wire. Though it may depend on a diameter of the wire, the height of the wire above the chip may be at least one hundred micron (100 μm). This extra height may impede the ability to make thinner packages.

In order to solve the above problem, a conventional bump reverse bonding technique has been developed. In this technique, a ball bond is formed on the substrate, whereas a stitch bond is formed on the chip. The stitch bond on the chip is made possible placing a ball bump on the bond pad of the chip. The stitch bond on the chip provides a connection without a loop over the bond pad. Related techniques are disclosed in U.S. Pat. Nos. 5,328,079 and 5,735,030, and Korean Patent No. 0350084.

The bump reverse bonding, however, encounters an increase in process time due to unnecessary motion of the capillary. FIG. 7 shows the motion of the capillary in a conventional bump reverse bonding. Referring to FIG. 7, initially, the capillary (not shown) is located above the bond pad 52 of the chip 50 to form a ball bump 82. After the ball bump 82 is formed on the bond pad 52, the capillary moves toward the bond position 62 of the substrate. Then the capillary performs a ball bonding on the bond position 62 and returns to the chip 50 for a stitch bond on the bond pad 52.

As described above, the conventional bump reverse bonding requires the capillary to travel from the bond pad 52 to the bond position 62 and back again to connect one bond pad 52 of the chip 50 and one bond position 62 of the substrate. As shown in FIG. 7, a movement of the capillary from the bond pad 52 to the bond position 62, depicted as a dotted line is only to transfer the wire, rather than to connect the wire. Movement of the capillary depicted as a solid line represents a motion of the capillary to connect the wire, rather than just transfer the wire.

SUMMARY OF THE INVENTION

Exemplary embodiments of the present invention provide a more efficient semiconductor device.

Exemplary embodiments of the present invention reduce or eliminate unnecessary motion of the capillary.

Exemplary embodiments of the present invention reduce or eliminate capillary movements to just transfer a wire from one position to another.

In an embodiment of the present invention, a wire bonding method includes providing a semiconductor chip disposed on a substrate, wherein the chip has a bond pad and the substrate has a bond position arranged thereon, providing wires to connect the bond pad and the bond position, forming a ball bump on the bond pad of the chip, forming a first stitch bond of the wire on the ball bump, and forming a second stitch bond of the wire on the bond position.

In another embodiment of the present invention, a wire bonding method includes providing a semiconductor chip disposed on a substrate, wherein the chip has a bond pad and the substrate has a bond position arranged thereon, providing a wire through a capillary so as to connect the bond pad and the bond position, forming a ball on an end of the wire which extends from the capillary, forming a ball bump on the bond pad of the chip by pressing down the ball of the wire on the bond pad, separating the ball bump from the wire so as to remain on the bond pad, forming a first stitch bond of the wire on the ball bump by pressing down the wire on the ball bump, moving the capillary from the bond pad to the bond position, while loosening the wire, forming a second stitch bond of the wire on the bond position by pressing down the wire on the bond position, and separating the second stitch bond from the wire within the capillary.

In another embodiment of the present invention, the chip has ball bumps formed beforehand on the bond pads.

In another embodiment of the present invention, a wire bonding method includes providing a semiconductor chip disposed on a substrate, wherein the chip has a bond pad and the substrate has a bond position arranged thereon and the bond pad has a ball bump arranged thereon, providing a wire through a capillary so as to connect the bond pad and the bond position, forming a first stitch bond of the wire on the ball bump by pressing down the wire on the ball bump, moving the capillary from the bond pad to the bond position, while loosening the wire, forming a second stitch bond of the wire on the bond position by pressing down the wire on the bond position, and separating the second stitch bond from the wire within the capillary.

In another embodiment of the present invention, a semiconductor chip includes at least one bond pad for connection via a wire to at least one bond position of a substrate and a ball-stitch bump formed on the at least one bond pad.

In another embodiment of the present invention, a semiconductor package includes a semiconductor chip including at least one bond pad and a ball-stitch bump formed on the at least one bond pad and a semiconductor substrate including at least one bond position for connection via a wire to the ball-stitch bump on the at least one bond pad.

In other embodiments of the present invention, the wire may include a gold wire, an aluminum wire, or a copper wire. In other embodiments of the present invention, the substrate may include a lead frame, a printed circuit board, a ceramic substrate, or a flexible circuit board.

BRIEF DESCRIPTION OF THE DRAWINGS

FIG. 1 shows a semiconductor chip disposed on a substrate; FIGS. 2 and 3 show forming a ball bump on the chip; FIG. 4 shows forming a ball-stitch stitch bond of a wire on the ball bump; and FIGS. 5 and 6 show forming another stitch bond of the wire on the substrate.

DETAILED DESCRIPTION OF EXEMPLARY EMBODIMENTS OF THE INVENTION

The present invention will now be described more fully hereinafter with reference to the accompanying drawings, in which several exemplary embodiments of the invention are shown. This invention may, however, be embodied in many different forms and should not be construed as limited to the exemplary embodiments set forth herein. Rather, these exemplary embodiments are provided so that this disclosure will be thorough and complete, and will fully convey the scope of the invention to those skilled in the art.

In the description, well-known structures and processes have not been shown in detail to avoid obscuring exemplary embodiments of the present invention. It will be appreciated that for simplicity and clarity of illustration, some elements illustrated in the figures have not necessarily been drawn to scale. For example, the dimensions of some of the elements are exaggerated relative to other elements for clarity. Like numerals are used for like and corresponding parts of the various drawings.

FIGS. 1 to 6 show cross-sectional views of a method of wire bonding for a semiconductor device in accordance with an exemplary embodiment of the present invention.

Figure 1:
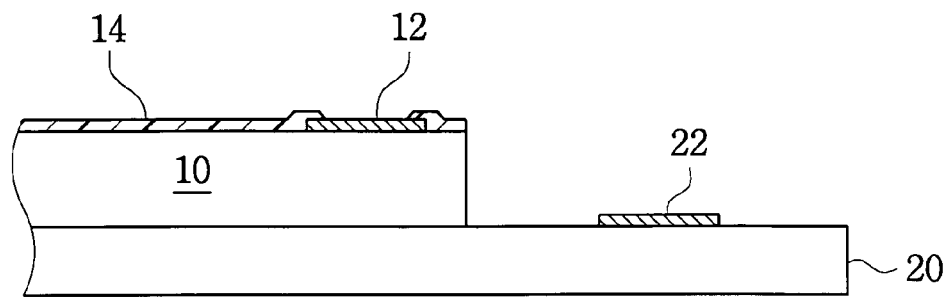
FIGS. 1 to 6 schematically show cross-sectional views of a method of wire bonding for a semiconductor device in accordance with an exemplary embodiment of the present invention. More specifically.

The method may start by providing a semiconductor chip and a substrate. FIG. 1 shows the chip 10 disposed on the substrate 20. Referring to FIG. 1, the chip 10 may have a multiplicity of bond pads 12 arranged thereon. A top surface of the chip 10, except for the bond pads 12, may be covered with a passivation layer 14. The chip 10 is attached to the substrate 20. The substrate 20 may have a multiplicity of bond positions 22 formed thereon, for example, around the chip 10. The substrate 20 may be a lead frame, a printed circuit board, a ceramic substrate, a flexible circuit board, or other well-known substrate.

Figure 2:
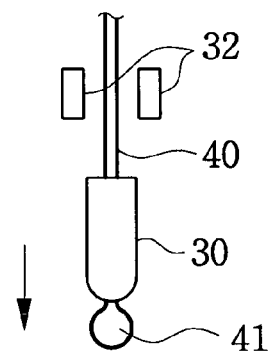
Figure 2:
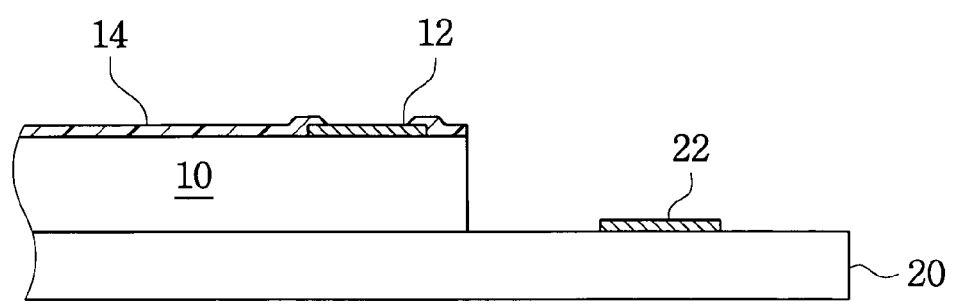
Figure 3:
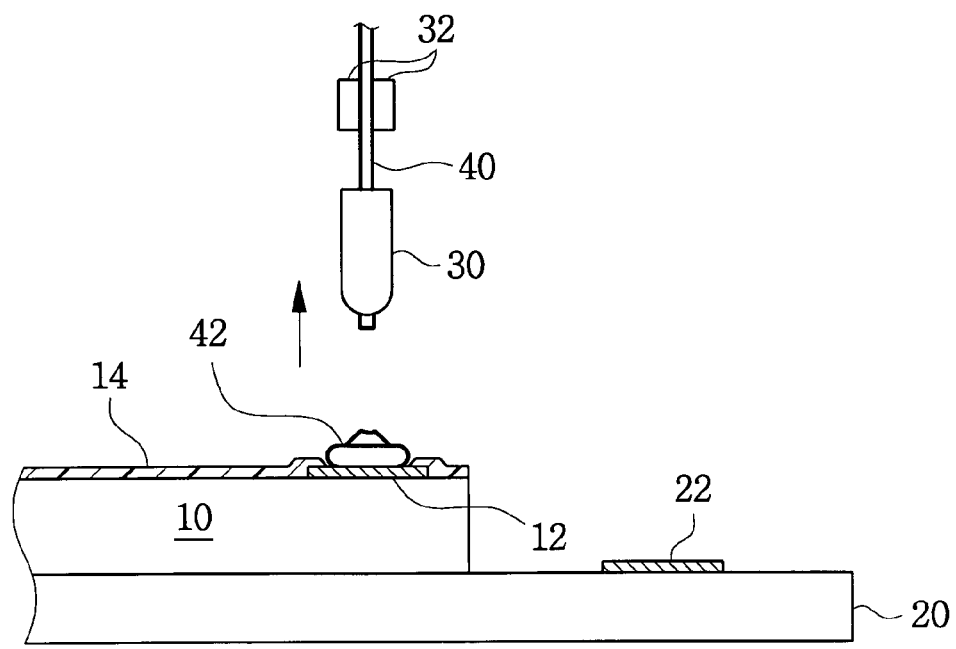

As shown in FIGS. 2 and 3, a ball-stitch bump 42 may be formed on the bond pad 12 of the chip 10. In an exemplary embodiment, a ball 41 is formed on the tail of a wire 40, which extends from the end of a capillary 30 of a wire bonder. An electric flame and/or spark may be used to form the ball 41. The capillary 30 descends and presses down the ball 41 onto the bond pad 12 with or without ultrasonic energy. Therefore, the ball-stitch bump 42 is formed on the bond pad 12. The capillary 30 ascends while a clamp 32 of the wire bonder grips the wire 40. Therefore, the ball-stitch bump 42 is separated from the wire 40 and remains on the bond pad 12.

In an alternative embodiment, the ball-stitch bump 42 on the bond pad 12 may be formed beforehand without using the wire 40, for example, when the chip 10 is fabricated.

Figure 4:
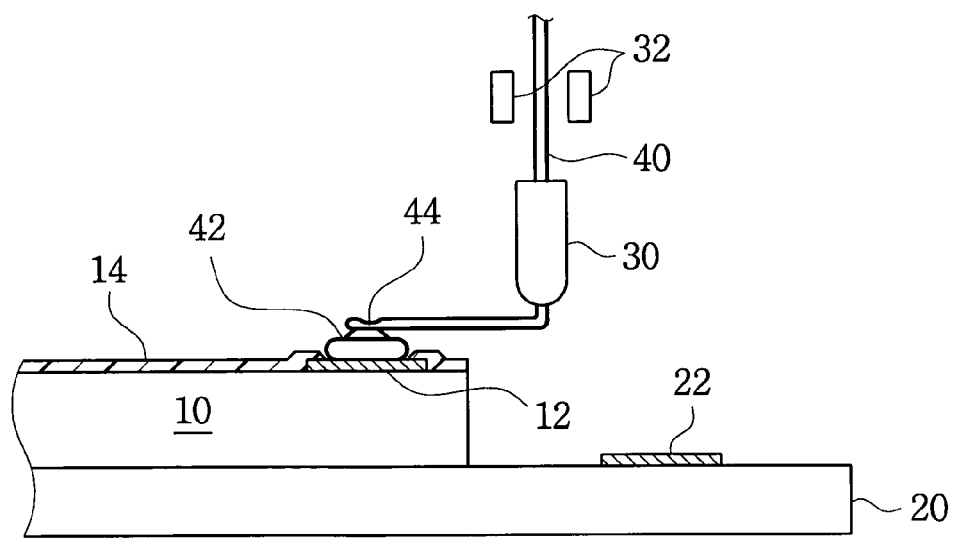

As shown in FIG. 4, a ball-stitch stitch bond 44 of the wire 40 is formed on the ball-stitch bump 42. Specifically, after the ball-stitch bump 42 remains on the bond pad 12, the capillary 30 descends again onto the ball-stitch bump 42. The capillary 30 presses down the tail of the wire 40, with or without ultrasonic energy, so the ball-stitch stitch bond 44 is produced on the ball-stitch bump 42. Thereafter, the capillary 30 moves toward the bond position 22 of the substrate, while loosening the wire 40.

As discussed above, in an exemplary embodiment, immediately after the ball-stitch bump 42 is formed, the ball-stitch stitch bond 44 is formed thereon. This allows a stable and reliable bond between the wire 40 and the ball-stitch bump 42 at the ball-stitch stitch bond 44.

Figure 5:
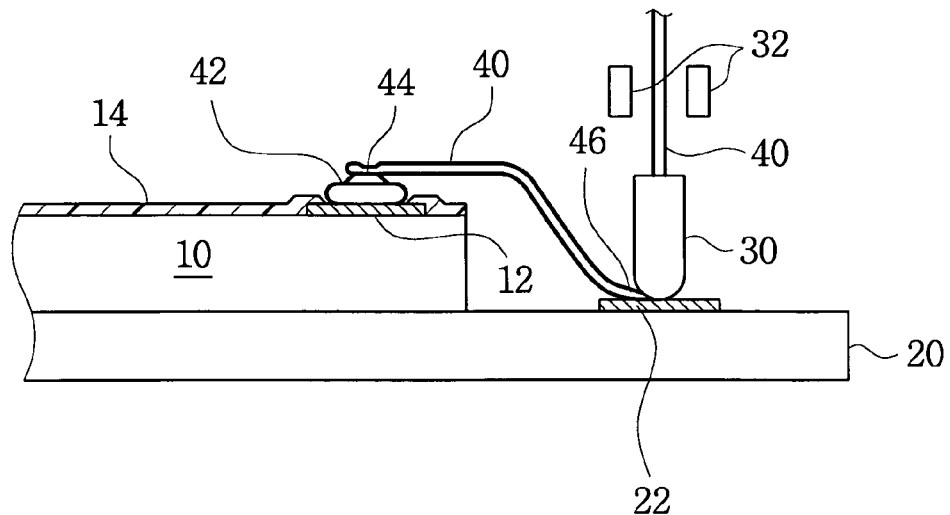

As shown in FIG. 5, another stitch bond 46 of the wire 40 is formed on the bond position 22 of the substrate. Specifically, after the ball-stitch stitch bond 44 is formed on the ball-stitch bump 42, the capillary 30 moves to the bond position 22 while loosening the wire 40. Then the capillary 30 presses down the wire 40 against the bond position 22 and accordingly the stitch bond 46 is formed on the bond position 22.

Figure 6:
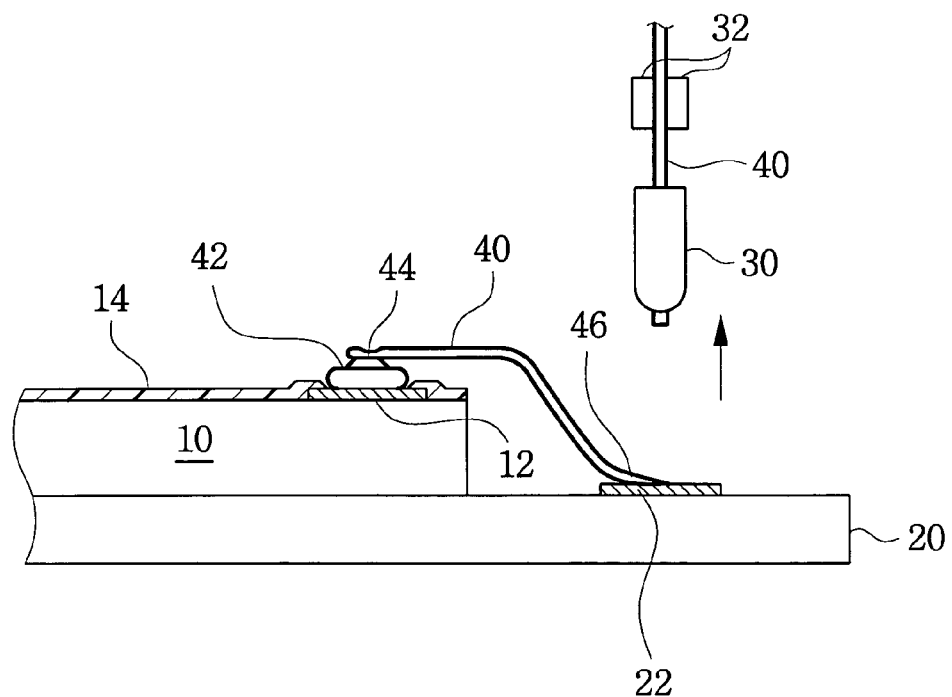

As shown in FIG. 6, the capillary 30 ascends and the clamp 32 grips the wire 40, so the wire 40 is cut from the stitch bond 46. The capillary 30 moves to the next bond pad 12 for ball formation, as shown in FIG. 8.

Figure 7:
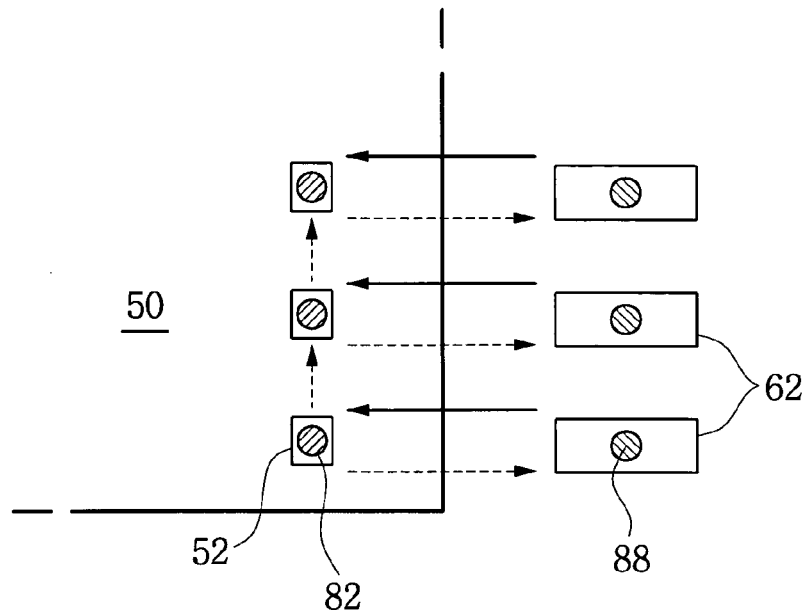
FIG. 7 shows a plan view of capillary movement in a conventional wire bonding method.
Figure 8:
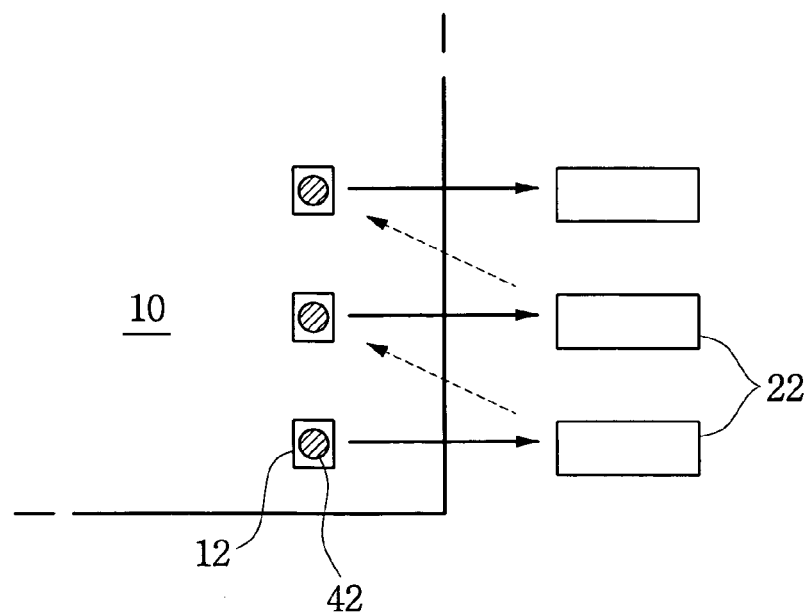
FIG. 8 shows a plan view of capillary movement in a wire bonding method in accordance with an exemplary embodiment of the present invention.

Referring to FIG. 8, in making a single wire connection, the capillary moves only from the bond pad 12 to the bond position 22 without returning to the bond pad 12 as in the conventional method shown in FIG. 7. Therefore, the exemplary methods of the present invention can reduce a moving path of the capillary, and accordingly reduce the time required for wire bonding and also increase output of wire bonding, as compared with the aforementioned conventional methods.

Furthermore, according to exemplary methods of the present invention, the wire connects the chip and the substrate by using a ball-stitch stitch bond and a stitch bond, respectively, as compared with the conventional methods using ball-stitch bonds or stitch-ball bonds. Since there is no ball bond, exemplary methods of the present invention do not require looping the wire above the ball bond at the neck, thereby reducing the height of the wire. This is more effective in case that there is a little difference in height between the bond pad and the bond position. In this case, the conventional ball bond may require a wire loop raised relative to the chip. However, exemplary methods of the present invention can reduce the height of the wire to the level of the chip.

Although exemplary embodiment of the present invention discussed above and the appended claims attached hereto may refer to "a" bond position, "a" bond pad, a ball-stitch bump, a ball-stitch bond, etc., it is intended that "a" in this context, can refer to one or more the relevant items. Further, although exemplary embodiment of the present invention discussed above and the appended claims attached hereto refer to a ball-stitch bump and a ball-stitch bond on the chip and no bump and a stitch bond on the substrate, it is evident that these two could be arranged in any combination. For example, no bump and a stitch bond could be provided on the chip and a ball-stitch bump and a ball-stitch bond could be provided on the substrate or the same type of bump/bond combination could be provided on both the substrate and the chip, as would be known to one of ordinary skill in the art.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A method of wire bonding, comprising:
providing a semiconductor chip disposed on a substrate, wherein the chip has a bond pad and the substrate has a bond position arranged thereon;
providing wires to connect the bond pad and the bond position;
forming a ball bump on the bond pad of the chip;
forming a first stitch bond of the wire on the ball bump immediately after forming the ball bump; and
forming a second stitch bond of the wire on the bond position.

2. The method of claim 1, wherein the wires include a gold wire, an aluminum wire, or a copper wire.

3. The method of claim 1, wherein the substrate includes a lead frame, a printed circuit board, a ceramic substrate, or a flexible circuit board.

4. The method of claim 1, wherein the first stitch bond is a ball-stitch stitch bond.

5. A method of wire bonding, comprising:
providing a semiconductor chip disposed on a substrate, wherein the chip has a bond pad and the substrate has a bond position arranged thereon;
providing a wire through a capillary so as to connect the bond pad and the bond position;
forming a ball on an end of the wire which extends from the capillary;
forming a ball bump on the bond pad of the chip by pressing down the ball of the wire on the bond pad;
separating the ball bump from the wire so as to remain on the bond pad;
forming a first stitch bond of the wire on the ball bump by pressing down the wire on the ball bump immediately after separating the ball bump;
moving the capillary from the bond pad to the bond position, while loosening the wire;
forming a second stitch bond of the wire on the bond position by pressing down the wire on the bond position; and
separating the second stitch bond from the wire within the capillary.

6. The method of claim 5, wherein the Wire includes a gold wire, an aluminum wire, or a copper wires.

7. The method of claim 5, wherein the substrate includes a lead frame, a printed circuit board, a ceramic substrate, or a flexible circuit board.

8. The method of claim 5, wherein the first stitch bond is a ball-stitch stitch bond.

9. A method of wire bonding, comprising:
providing a semiconductor chip disposed on a substrate, wherein the chip has a bond pad and the substrate has a bond position arranged thereon and the bond pad has a ball bump arranged thereon;
providing a wire through a capillary so as to connect the bond pad and the bond position;
forming a first stitch bond of the wire on the ball bump by pressing down the wire on the ball bump immediately after forming the ball bump;
moving the capillary from the bond pad to the bond position, while loosening the wire;
forming a second stitch bond of the wire on the bond position by pressing down the wire on the bond position; and
separating the second stitch bond from the wire within the capillary.

10. The method of claim 9, wherein the wire includes a gold wire, an aluminum wire, or a copper wire.

11. The method of claim 9, wherein the substrate includes a lead frame, a printed circuit board, a ceramic substrate, or a flexible circuit board.

12. The method of claim 9, wherein the first stitch bond is a ball-stitch stitch bond.

13. A method of wire bonding, comprising:
forming a ball-stitch stitch bond of a wire on a ball-stitch bump on a bond pad by pressing down the wire on the ball-stitch bump immediately after forming the ball-stitch bump;
moving a capillary from the bond pad to a bond position, while loosening the wire; and
forming a stitch bond of the wire on the bond position by pressing down the wire on the bond position.

14. A method of wire bonding a semiconductor package, including a semiconductor chip including at least one bond pad and a ball-stitch bump formed on the at least one bond pad and a semiconductor substrate including at least one bond position for connection via a wire to the ball-stitch bump on the at least one bond pad, said method comprising:
providing the semiconductor chip disposed on the substrate, wherein the chip has the at least one bond pad and the semiconductor substrate has the at least one bond position arranged thereon;
providing the wire to connect the at least one bond pad and the at least one bond position;
forming the ball-stitch bump on the at least one bond pad of the semiconductor chip;
forming a ball-stitch stitch bond of the wire on the ball-stitch bump immediately after forming the ball-stitch bump; and
forming a stitch bond of the wire on the at least one bond position.

* * * * *